US007214877B2

(12) United States Patent  
de la Borbolla

(10) Patent No.: US 7,214,877 B2
(45) Date of Patent: May 8, 2007

(54) ADHESIVELY MOUNTED ELECTRICAL BOX ASSEMBLY

(75) Inventor: Ian Rubin de la Borbolla, Memphis, TN (US)

(73) Assignee: Thomas & Betts International, Inc., Wilmington, DE (US)

( * ) Notice: Subject to any disclaimer, the term of this patent is extended or adjusted under 35 U.S.C. 154(b) by 0 days.

(21) Appl. No.: 11/480,060

(22) Filed: Jun. 30, 2006

(65) Prior Publication Data

US 2007/0007028 A1   Jan. 11, 2007

Related U.S. Application Data

(60) Provisional application No. 60/696,691, filed on Jul. 5, 2005.

(51) Int. Cl.
 *H01H 9/02* (2006.01)
(52) U.S. Cl. .......................... 174/58; 174/50; 174/63; 248/217.2
(58) Field of Classification Search ............ 174/57–58, 174/63, 50; 220/3.9, 3.92, 3.3; 248/217.2, 248/217.3, 906; 439/535; 361/600
See application file for complete search history.

(56) References Cited

U.S. PATENT DOCUMENTS

| 2,586,728 | A |  | 2/1952 | Shepard |
|---|---|---|---|---|
| 2,665,865 | A |  | 1/1954 | Bell |
| 3,097,821 | A |  | 7/1963 | Richards |
| 3,360,151 | A |  | 12/1967 | Yznaga |
| 3,474,994 | A |  | 10/1969 | Swanquist |
| 3,588,019 | A |  | 6/1971 | Cozeck et al. |
| 3,720,395 | A |  | 3/1973 | Schuplin |
| 3,730,466 | A |  | 5/1973 | Swanquist |
| 3,780,209 | A |  | 12/1973 | Schuplin |
| 3,963,204 | A |  | 6/1976 | Liss |
| 3,977,640 | A |  | 8/1976 | Arnold et al. |
| 4,108,414 | A |  | 8/1978 | Grant, Sr. |
| 4,140,293 | A | * | 2/1979 | Hansen .................... 248/217.2 |
| 4,226,393 | A |  | 10/1980 | Rardin et al. |
| 4,362,284 | A |  | 12/1982 | Bolante |
| 4,447,030 | A |  | 5/1984 | Nattel |
| 4,483,453 | A |  | 11/1984 | Smolik |
| 4,693,438 | A |  | 9/1987 | Angell |
| 4,747,506 | A |  | 5/1988 | Stuchlik, III |
| 4,874,334 | A |  | 10/1989 | Golden |
| 4,971,280 | A |  | 11/1990 | Rinderer |
| 5,004,199 | A |  | 4/1991 | Suk |
| 5,239,132 | A |  | 8/1993 | Bartow |
| 5,408,045 | A |  | 4/1995 | Jorgensen et al. |
| 5,677,512 | A |  | 10/1997 | Reiker |
| 6,207,898 | B1 |  | 3/2001 | Reiker |
| 6,389,658 | B1 |  | 5/2002 | Pfaller et al. |
| 6,484,979 | B1 |  | 11/2002 | Medlin, Jr. |
| 6,484,980 | B2 |  | 11/2002 | Medlin, Sr. et al. |
| 6,573,446 | B1 |  | 6/2003 | Umstead et al. |

* cited by examiner

*Primary Examiner*—Dhiru R. Patel
(74) *Attorney, Agent, or Firm*—Hoffmann & Baron, LLP

(57) ABSTRACT

This invention pertains to an electrical box assembly for securing to a stud using an adhesive. The assembly includes an electrical enclosure, a bracket and at least one pair of opposed pads. The bracket is affixed to the enclosure and defines a stud-receiving cavity extending along an edge of the enclosure. The at least one pair of opposed pads are substantially disposed within the cavity and have a portion thereof for engaging the stud. The pads are sized and configured to receive the adhesive on the portion.

17 Claims, 5 Drawing Sheets

ADHESIVELY MOUNTED ELECTRICAL BOX ASSEMBLY

This application claims the benefit of U.S. Provisional Application No. 60/696,691 filed Jul. 5, 2005.

BACKGROUND OF THE INVENTION

This invention pertains in general to an electrical enclosure, housing or assembly that is supported from a stud; and more particularly to a bracket affixed to the enclosure that once applied to the stud, requires no further operation, installation step or hardware for the supported enclosure to be in compliance with industry code. The principal method of attachment of the bracket to the stud is via adhesion.

Electrical enclosures, frames, housings, boxes or the like are quite common and are extensively used to support fixtures to which high and low voltage wires are terminated. Examples of such fixtures are electrical switches, receptacles, telephone jacks, cable connections and other power or communication devices. Such enclosures supporting these fixtures are not free-standing and thus require support within the building structure if they are to be installed in accordance with local or national codes. These codes often specify a certain loading or series of forces the enclosure must withstand after being installed. Perhaps the most common way of supporting such devices is via nails or screws inserted through openings in the device before being driven into a stud of the building. Other methods of securing the electrical enclosure to the building include a separate elongated metal bracket that spans between adjacent studs, the enclosure then being bolted or screwed to the bracket. Another method involves a metal bracket affixed directly to the box itself that is pushed onto or against a stud and then subsequently fastened in place via nails or screws.

As quick and simple as the above may appear, the operation of driving or fastening the nail or screw is still a secondary operation that must be completed after the box is initially positioned. This secondary operation requires time, some more than others, and thus prolongs the amount of time it takes to install the box in a fashion that will comply with local code. Such secondary operations also limit the number of boxes that may be installed in a given period of time.

To ease installation when it is known that a nail or screw is to be used, electrical outlet boxes are oftentimes made were the nail or screw is held captive on the device prior to installation. Thus, to cut down on the number of secondary steps required, the user need only drive the nail or screw home after the box is positioned against the stud. However, care has to be taken to insure that the step of screwing or nailing does not move the box out of position. Also, care has to be taken that this additional fastening hardware is not dropped or lost. Furthermore, the user has to be mindful of how the box is held during the driving operation so that the step of swinging a hammer or installing a screw does not inadvertently result in personal injury or damage to the enclosure.

Thus, it becomes desirable to avoid these secondary securement steps so that more boxes can be installed in the same period of time. It is also desirable to dispense with these separate fasteners or screws as this only adds cost and another assembly step in the manufacture of the final product. Furthermore, such fasteners can be lost. Safety is also a factor as one injury can result in considerable and quite unexpected cost and delay. Another desirable feature is to have the box automatically secured to the stud upon initial installation with no further operation required by the installer. Yet another desirable feature is a low cost box that can be secured as above while still complying with local codes and ordinances. These and other objects and advantages of this invention will be described in greater detail below.

SUMMARY OF THE INVENTION

This invention pertains to an electrical box assembly for securing to a stud using an adhesive. The assembly comprises an electrical enclosure, a bracket and at least one pair of opposed pads. The bracket is affixed to the enclosure and defines a stud-receiving cavity extending along an edge of the enclosure. The at least one pair of opposed pads are substantially disposed within the cavity and have a portion thereof for engaging the stud. The pads are sized and configured to receive the adhesive on the portion.

The assembly may include additional features in accordance with further aspects of the invention. As such, the at least one pair of opposed pads can be biased toward the stud. Also, the pads can be pivotally mounted with respect to the bracket. With regard to the bracket, it can include a flange having a slightly concave shape supporting at least one of the pads The concave shape can bias a pad toward the stud. Further, the bracket can include a stiffener secured to the flange for resisting deflection. Further still, the bracket can include a pair of flanges having a concave shape that are generally parallel to each other. The pair of flanges can form two sides of the stud receiving cavity. Additionally, the assembly can include a drywall support extending from the enclosure opposite the bracket. Also, the assembly can include a guide for aligning the assembly relative to the stud. The electrical enclosure or box can include a single or multiple gang electrical outlet box or a low voltage outlet frame. Yet further still, the assembly can include the adhesive disposed on the portion of the pads, as well as a removable protective sheet sized to cover the adhesive. The protective sheet is preferably adapted to be easily removed prior to installation of the assembly on the stud.

Another aspect of the present invention is an assembly for supporting an electrical enclosure wherein the enclosure is configured with a bracket extending from a first side of the enclosure. This bracket, in turn, is configured with a first generally planar surface and at least one flange extending generally orthogonal to the planar surface. The planar surface and the one or more flanges form perimeter portions of an adjacent stud receiving cavity. The flange is, in turn, configured to support one or more adhesive pad surfaces thereon that extend into the stud receiving cavity. These adhesive pad surfaces are configured for an adhesive to be applied thereto wherein upon the insertion of a stud into the stud receiving cavity, the adhesive pad surfaces bias the adhesive against the stud.

These and other objects, features, and advantages of this invention will become apparent from the following detailed description of illustrative embodiments thereof, which is to be read in connection with the accompanying drawings.

DETAILED DESCRIPTION OF THE PREFERRED EMBODIMENT

Figure 1:
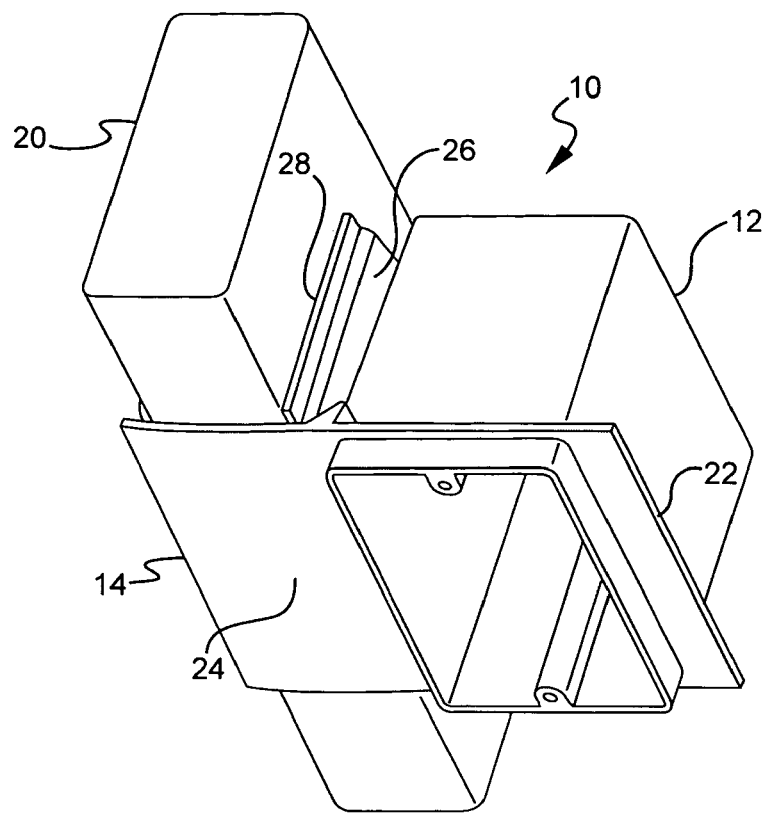
FIG. 1 is a front perspective view of an electrical box assembly, in accordance with the present invention, mounted onto a stud.
Figure 7:
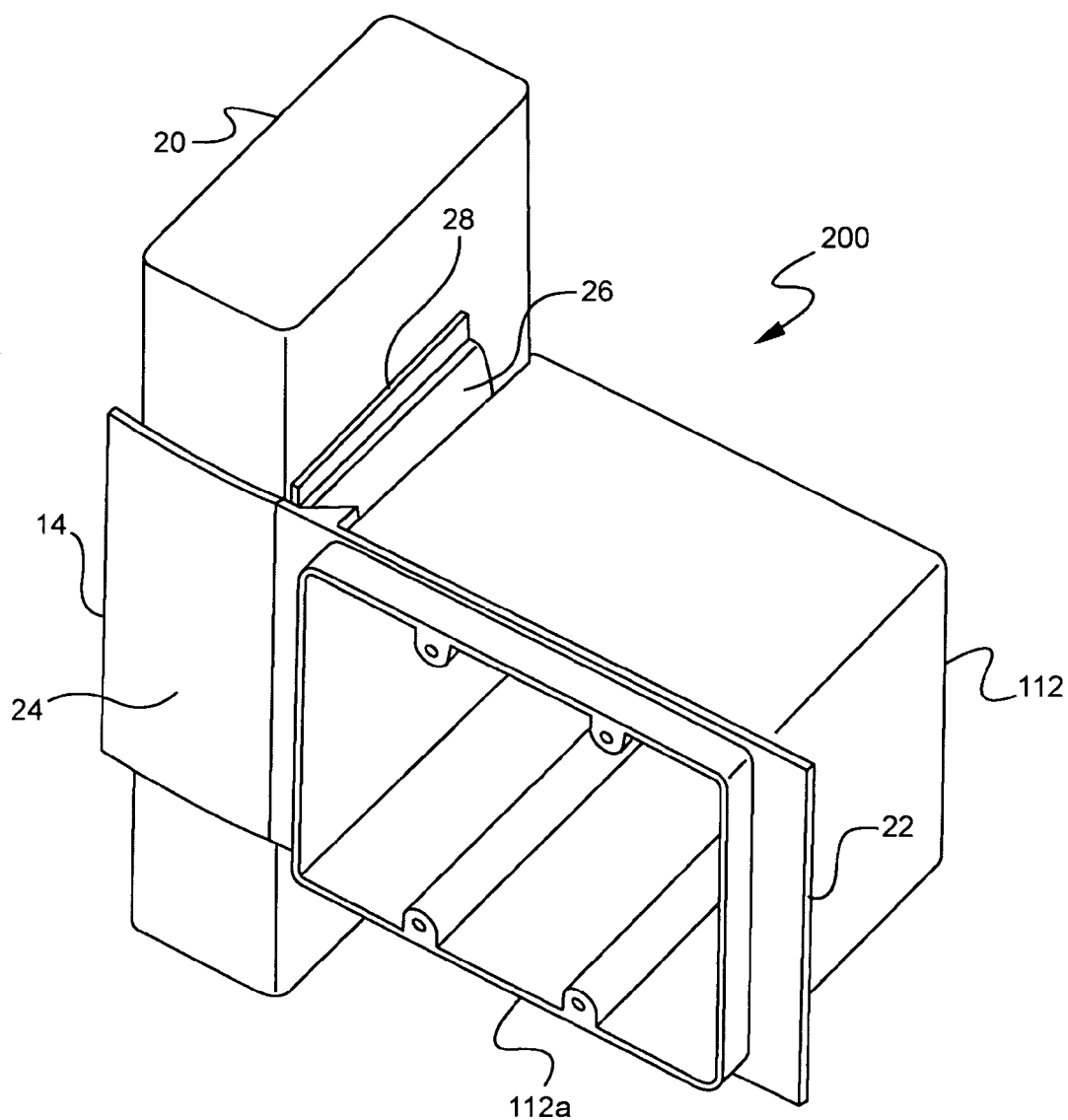
FIG. 7 is front perspective view of an alternate multi-gang electrical box assembly, in accordance with the present invention, mounted onto a stud.

Referring to the figures, FIG. 1 illustrates an electrical box assembly 10 comprising box or housing 12 and bracket 14. It should be understood from the outset, that box or housing 12 can comprise a single or a multiple gang outlet box, as shown in FIG. 7. Also, box 12 can comprise a combo box or enclosure of the type shown in U.S. Pat. No. 6,727,428 wherein both a power connection and a low voltage connection can be made. Furthermore, box 12 can comprise simply a low voltage frame similar to the low voltage frame shown and described in the above U.S. patent. Other structures are equally likely for box 12 and are meant to be included herein.

Box 12 may be of typical construction except for the inclusion of bracket 14. Box assembly 10 is also preferably of one piece plastic construction and its method of manufacture is preferably molding, but of course a metal assembly or a combination of metal and plastic (i.e. two or more pieces) are equally suitable. Likewise, other methods of manufacture may be employed to create this assembly other than molding.

Figure 2:
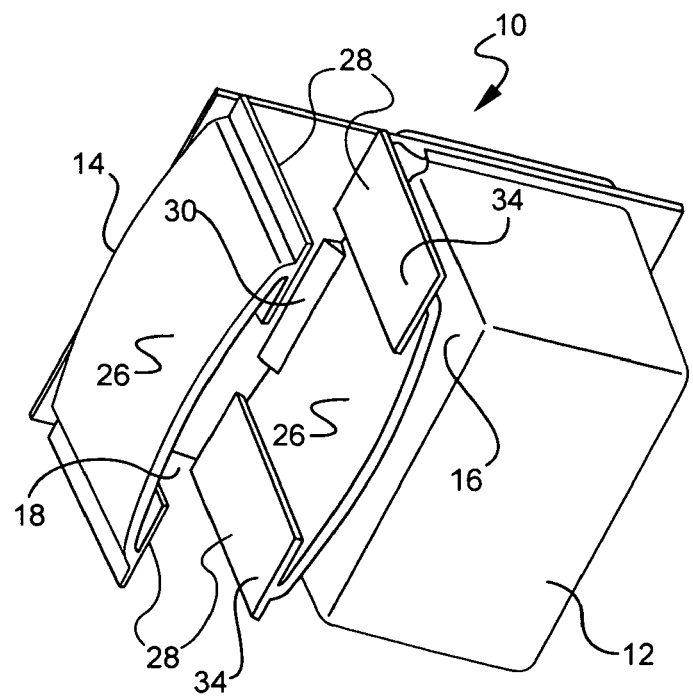
FIG. 2 is a rear perspective view of the assembly shown in FIG. 1, without the stud.
Figure 3:
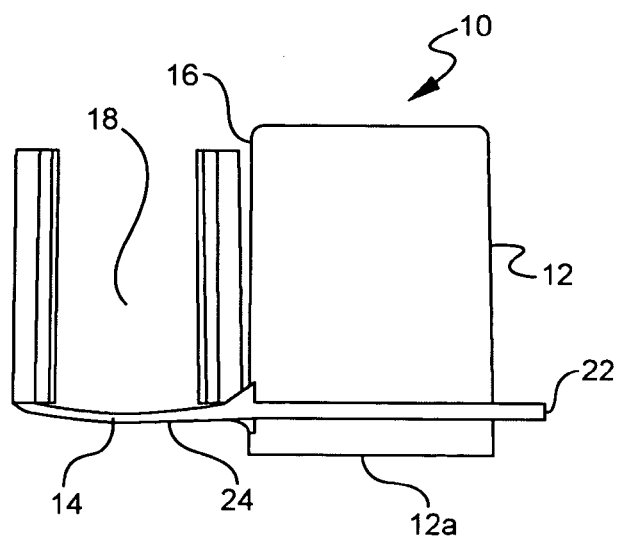
FIG. 3 is a top view of the assembly shown in FIG. 1.
Figure 4:
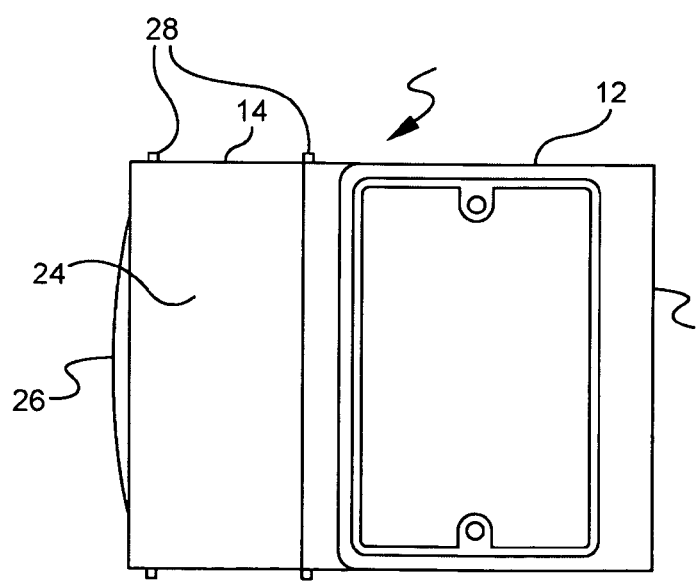
FIG. 4 is a front view of the assembly shown in FIG. 1.
Figure 5:
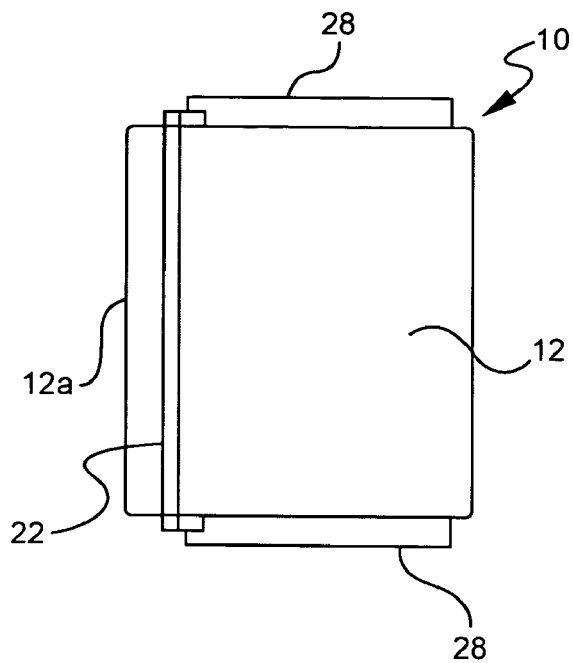
FIG. 5 is a side view of the assembly shown in FIG. 1.
Figure 8:
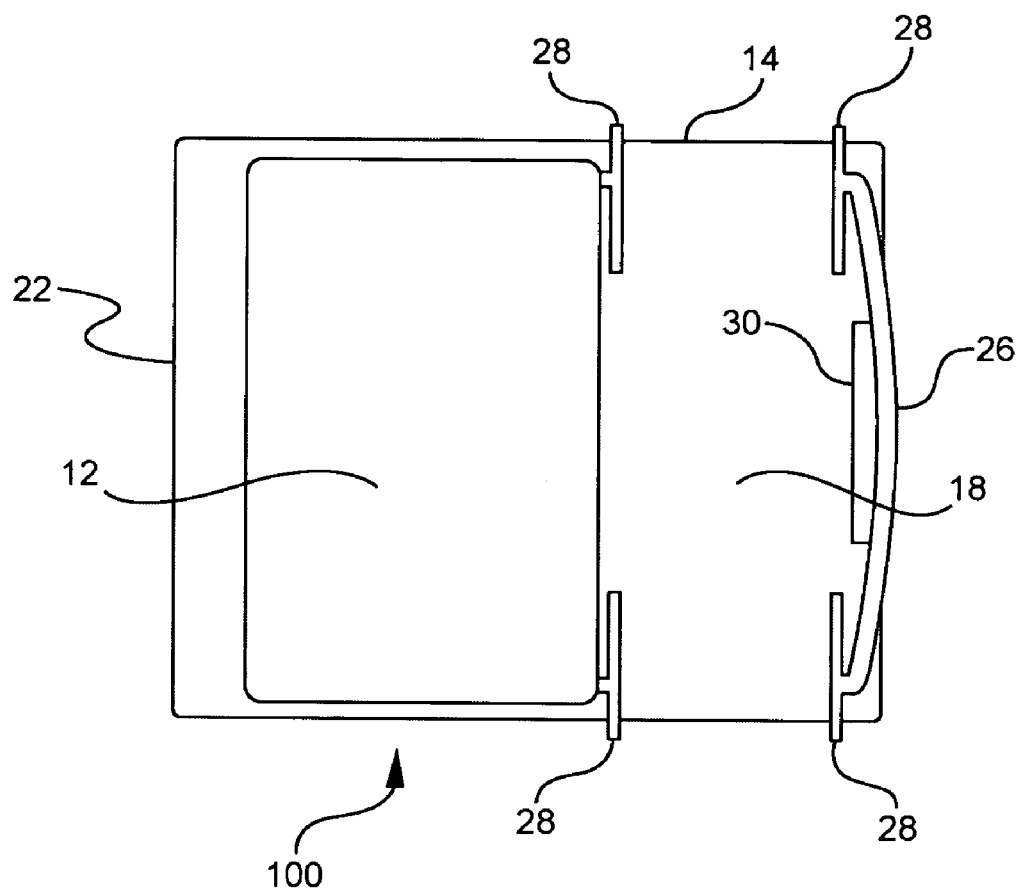
FIG. 8 is rear view of a further alternate electrical box assembly, in accordance with the present invention.

As shown in FIGS. 2 and 3, bracket 14 extends from one side 16 of box 12 and is configured with stud receiving cavity 18 therein. Bracket 14 is designed so that stud 20 can easily be inserted within stud receiving cavity 18. As shown in FIGS. 3 and 5, bracket 14 secured to box 12 is shown inset or recessed from the front opening 12a of box 12. This accommodates drywall or other wall covering that will surround the box. While this embodiment shows stud receiving cavity 18 fully within bracket 14, an alternative embodiment could incorporate side 16 of box 12 as defining one side of stud receiving cavity 18, as shown in FIG. 8.

Opposite bracket 14 (or even surrounding box 12) but at the same inset depth as bracket 14, is drywall support 22. Drywall support 22 braces the drywall material adjacent the front opening of box 12. Bracket 14 has a generally planar front surface 24 so as to permit the drywall to cover it without creating any bulges.

Figure 6:
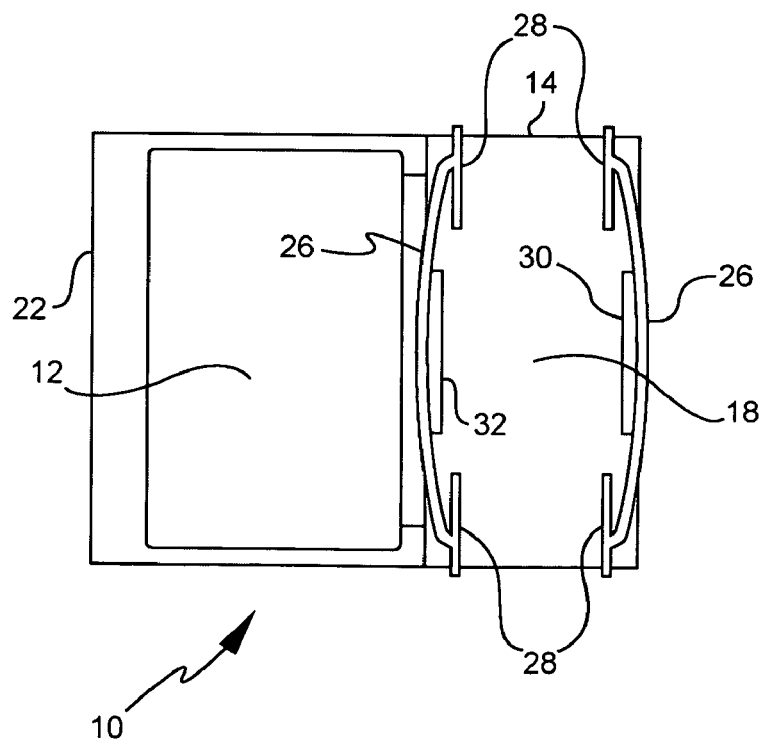
FIG. 6 is a rear view of the assembly shown in FIG. 1.

As shown in FIGS. 2 and 6, two flanges 26 form part of bracket 14 and extend from generally planar surface 24. These flanges 26 extend generally parallel to each other and to a side 16 of box 12. As indicated earlier, in the embodiment shown, these flanges 26 along with generally planar surface 24 of bracket 14 define stud receiving cavity 18 there between. As shown in the drawings, each flange 26 is slightly concave with respect to stud receiving cavity 18. Also, the opposite ends of each curved flange 26 are further configured with a generally planar pad surface 28 that are intended to engage stud 20. Thus, whenever stud 20 is placed within stud receiving cavity 18, the deflection and curved nature of flange 26 helps bias pad surfaces 28 against stud 20. These planar pad surfaces 28 are also somewhat pivotally secured to flange 26 so that as much of their full planar surface can engage the side of stud 20 due to the bias applied.

While this embodiment discloses two pad surfaces 28 forming a part of each flange 26, there could be more or fewer such pad surfaces 28 such that one curved end region of flange 26 may not contain a pad surface 28 at all or each end region may contain more than one pad surface 28. The decision is left up to the manufacturer.

It should be noted that the planar front surface 24 can also be made slightly concave with respect to stud receiving cavity 18. Hence, this slightly curved planar front surface 24 will, when straightened, apply a bias to opposite flanges 26. These flanges 26, in turn, are designed to apply a bias to pad surfaces 28. This accumulated bias will hence result in a clamping or grasping force being applied to the stud 20.

If desired, stiffeners 30 and 32 may be employed within or adjacent stud receiving cavity 18 so as to decrease or eliminate any unwanted deflection of either planar front surface 24 or flanges 26.

An adhesive substance 34, whether it be in solid or liquid form and whether it is sprayed on, dipped, manually applied or otherwise, is applied to one or more pad surfaces 28. Thus, the adhesive could take the form of a double sided adhesive tape.

Preferably, after application, adhesive 34 is covered with a protective sheet, coating or barrier so as to retain its adhesive qualities until needed by the installer. Alternatives to this may be to employ one component of a multi-component adhesive formula such that the remaining component(s) or reactant(s) is/are applied on the job site. Also, it maybe desired to supply box assembly 10 without any such adhesive 34 on pad surfaces 28 such that the installer can apply his/her own desired adhesive or a preferred adhesive can be separately supplied with box assembly 10 for field application.

Box assembly 10 may also be configured with alignment indicia (not shown) so that the installer can readily position box assembly 10 at the correct location on stud 20. Such indicia may take the form of a line, a marker, a slot, an opening or something else, the chosen design being determined by the manufacturer from a variety of possibilities.

In operation, a user would first note where box assembly 10 is to be applied to stud 20 so that it may be properly placed thereon without the need for re-alignment once installed. Usually, prior to box installation, stud 20 is marked not only as to the height of the box on the stud, but whether box 12 is to be a single gang box, a multi-gang box, a combination box supporting both power and low voltage fixtures or simply a low voltage frame.

Once the location of box assembly 10 is established, the user exposes adhesive 34 on pad surface 28 such as by uncovering it or applying the reactant, or even applying adhesive to pad surface 28 in the field as discussed above. Afterwards, using the alignment indicia, the user installs box assembly 10 by inserting stud 20 within stud receiving cavity 18. Such insertion will force pad surfaces 28 to pivot so as to be in better, if not perfect, alignment with respect to the sides of stud 20. This act will also cause flanges 26 to be flexed slightly outwardly away from 15 stud receiving cavity 18. Such deflection will cause even greater bias to occur at the curved end regions of flanges 26 where pad surfaces 28 are located. Hence, each pad surface 28 will be more biased against its respective surface of stud 20.

Furthermore, the engagement of stud 20 with planar front surface 24 and/or the flexing of flanges 26, causes planar front surface 24 to straighten or lessen its curvature. This deflection of surface 24 will create even more bias in bracket 14 so that even more force is now applied by flanges 26 and hence pad surfaces 28 upon stud 20. All these biasing steps occur automatically without any secondary operation or step by the installer. Thus, when using a slow curing adhesive 34, the installer need not wait for it to cure before releasing the box assembly 10 on the stud 20. Preferably, the biasing in the bracket 14 provides enough grip to hold the box assembly to the stud while a slow cure adhesive 34 sets. However, in the embodiment using a quick set adhesive, such as that commonly found on adhesive tape, the bracket could have less or even no bias.

Upon curing, box assembly 10 is fixed in place without the need for any secondary operation or further fastening steps by the installer. No nailing or screwing is required to bring box 12 in compliance with local or national code with respect to load bearing as it already is in such compliance. This adhesive manner of securing thus provides for assured and continued gripping of stud 20; box 12 will now be installed such that it resists subsequent movement.

It should be understood that while box assembly 10 has been shown with stud receiving cavity 18 being defined via a pair of flanges 26, as stated earlier, cavity 18 can also be defined employing side 16. In this latter situation, pad surfaces 28 would then also be secured to side 16 in a like manner as it is secured to flange 26. While select preferred embodiments of this invention have been illustrated, many modifications may occur to those skilled in the art and therefore it is to be understood that these modifications are incorporated within these embodiments as fully as if they were fully illustrated and described herein.

Although illustrative embodiments of the present invention have been described herein with reference to the accompanying drawings, it is to be understood that the invention is not limited to those precise embodiments, and that various other changes and modifications may be applied therein by one skilled in the art without departing from the scope or spirit of the invention.

What is claimed is:

1. An electrical box assembly for securing to a stud using an adhesive, comprising: an electrical enclosure; a bracket affixed to said enclosure and defining a stud-receiving cavity extending along an edge of said enclosure; and at least one pair of opposed pads substantially disposed within said cavity, said pads including at least one generally planar surface thereon for planar engagement with said stud, said pads sized and configured to receive said adhesive on said planar surface.

2. The assembly of claim 1, wherein at least one pad of said at least one pair of opposed pads is biased toward said stud.

3. The assembly of claim 1, wherein said pads are pivotal with respect to said bracket.

4. The assembly of claim 1, wherein said bracket includes a flange having a slightly concave shape supporting at least one of said pads, wherein said concave shape biases said at least one of said pads toward said stud.

5. The assembly of claim 4, wherein said bracket further includes a stiffener secured to said flange for resisting deflection thereof.

6. The assembly of claim 1, wherein said bracket includes a pair of flanges having a concave shape and generally parallel to each other, wherein said concave shape biases said at least one of said pads toward said stud, and said pair of flanges forming two sides of said stud receiving cavity.

7. The assembly of claim 1, further comprising a drywall support extending from said enclosure, and substantially disposed on an opposite side of said enclosure from said bracket.

8. The assembly of claim 1, wherein at least one of said pads is moveable between a first position substantially within said cavity prior to mounting on said stud and a second position substantially outside said cavity upon said mounting.

9. The assembly of claim 1, wherein said electrical enclosure includes at least one of a single gang electrical outlet box, a multiple gang electrical outlet box or a low voltage outlet frame.

10. An electrical box assembly for securing to a stud, comprising: an electrical enclosure; a bracket affixed to said enclosure and defining a stud-receiving cavity extending along an edge of said enclosure; at least one pair of opposed pads, wherein each of said pads includes a generally planar surface for engaging said stud, at least one of said pads is moveable between a first position substantially within said cavity prior to mounting on said stud and a second position substantially outside said cavity upon said mounting; and an adhesive disposed on at least one of said surfaces for securing said assembly to said stud, said surfaces facing an inner portion of said cavity.

11. The assembly of claim 10, further comprising:
a removable protective sheet sized to cover said adhesive prior to installation.

12. The assembly of claim 10, wherein at least one pad of said at least one pair of opposed pads is biased toward said stud.

13. The assembly of claim 10, wherein said pads are pivotal with respect to said bracket.

14. The assembly of claim 10, wherein said bracket includes a slightly concave portion supporting at least one of said pads, wherein said concave portion biases said at least one of said pads toward said stud.

15. The assembly of claim 10, further comprising a drywall support extending from said enclosure, and substantially disposed on an opposite side of said enclosure from said bracket.

16. The assembly of claim 10, wherein said electrical enclosure includes at least one of a single gang electrical outlet box, a multiple gang electrical outlet box or a low voltage outlet frame.

17. The assembly of claim 10, wherein said engagement with said stud is a planar engagement wherein said adhesive is disposed between at least one of said pads and said stud for securing said planar engagement.

* * * * *